US010570015B2

(12) United States Patent
    Todorov

(10) Patent No.:     US 10,570,015 B2
(45) Date of Patent:    Feb. 25, 2020

(54) MINIMIZING TIN LOSS DURING THERMAL PROCESSING OF KESTERITE FILMS

(71) Applicant: International Business Machines Corporation, Armonk, NY (US)

(72) Inventor: Teodor K. Todorov, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/255,929

(22) Filed: Sep. 2, 2016

(65) Prior Publication Data

US 2018/0069146 A1    Mar. 8, 2018

(51) Int. Cl.
    *H01L 31/032*    (2006.01)
    *C01B 19/00*     (2006.01)

(52) U.S. Cl.
    CPC ........ *C01B 19/007* (2013.01); *H01L 31/0326* (2013.01)

(58) Field of Classification Search
    CPC ............. H01L 31/1864; H01L 31/0326; H01L 31/1884; C01B 19/007; C01G 19/006; C04B 37/00; C04B 37/023; C04B 2237/064; C04B 2237/08; C04B 2237/36; C04B 2237/402; C04B 2237/405
    See application file for complete search history.

(56) References Cited

U.S. PATENT DOCUMENTS

| 4,563,734 A | 1/1986 | Mori et al. |
| RE35,716 E | 1/1998 | Stapleton et al. |
| 6,111,225 A | 8/2000 | Ohkase et al. |
| 6,394,797 B1 | 5/2002 | Sugaya et al. |
| 7,410,355 B2 | 8/2008 | Granneman et al. |
| 8,349,085 B2 | 1/2013 | Tahara et al. |

(Continued)

FOREIGN PATENT DOCUMENTS

| CN | 104795469 A | 7/2015 |
| CN | 103173823 B | 9/2015 |

(Continued)

OTHER PUBLICATIONS

A. Weber et al., "On the Sn loss from thin films of the material system Cu—Zn—Sn—S in high vacuum," Journal of Applied Physics 107, 013516 (Jan. 2010).

(Continued)

*Primary Examiner* — Brigitte A Paterson
(74) *Attorney, Agent, or Firm* — Vazken Alexanian; Michael J. Chang, LLC

(57) ABSTRACT

Techniques for minimizing loss of volatile components during thermal processing of kesterite films are provided. In one aspect, a method for annealing a kesterite film is provided. The method includes: placing a cover over the kesterite film; and annealing the cover and the kesterite film such that, for an entire duration of the annealing, the cover is at a temperature T1 and the kesterite film is at a temperature T2, wherein the temperature T1 is greater than or equal to the temperature T2. Optionally, during a cool down segment of the annealing, conditions can be reversed to have the temperature T1 be less than the temperature T2. A solar cell and method for formation thereof using the present annealing techniques are also provided.

16 Claims, 13 Drawing Sheets

(56) References Cited

U.S. PATENT DOCUMENTS

| | | |
|---|---|---|
| 8,501,526 B2 | 8/2013 | Teeter et al. |
| 9,064,700 B2 | 6/2015 | Wong et al. |
| 9,157,153 B2 | 10/2015 | Munteanu et al. |
| 9,236,283 B2 | 1/2016 | Sahoda et al. |
| 9,238,861 B2 | 1/2016 | Munteanu et al. |
| 9,349,906 B2 | 5/2016 | Mahajan et al. |
| 2006/0027317 A1* | 2/2006 | Joseph ............... B01L 3/50851 156/272.2 |
| 2013/0217214 A1* | 8/2013 | Munteanu ......... H01L 21/02557 438/479 |
| 2013/0269783 A1 | 10/2013 | Berg et al. |
| 2014/0008352 A1 | 1/2014 | Uemura et al. |
| 2016/0225933 A1* | 8/2016 | You ........................ H01L 31/18 |

FOREIGN PATENT DOCUMENTS

| | | |
|---|---|---|
| CN | 103343318 B | 11/2015 |
| KR | 20130016528 A | 2/2013 |

OTHER PUBLICATIONS

English Translation of CN103343318B by Yang Chunlei et al., Nov. 18, 2015.

English Translation of KR20130016528A by Gwak Ji Hye et al., Feb. 18, 2013.

List of IBM Patents or Applications Treated as Related (U.S. Appl. No. 15/255,871, filed Sep. 2, 2016 and U.S. Appl. No. 15/255,929, filed Sep. 2, 2016) (2 pages).

English translation of CN104795469A by Yuan Xiangdong et al., Jul. 22, 2015 (6 pages).

English translation of CN103173823B by Ren Cunsheng et al., Sep. 30, 2015 (5 pages).

\* cited by examiner

MINIMIZING TIN LOSS DURING THERMAL PROCESSING OF KESTERITE FILMS

FIELD OF THE INVENTION

The present invention relates to kesterite films, and more particularly, to techniques for minimizing loss of volatile components, such as tin (Sn) species, during thermal processing of kesterite films.

BACKGROUND OF THE INVENTION

Kesterite compounds, such as those containing copper (Cu), zinc (Zn), tin (Sn), and at least one of sulfur (S) and selenium (Se) (also referred to herein as "CZTS/Se" films), are promising semiconductors for future large-scale photovoltaic applications. However, the loss of volatile Sn compounds during the thermal processing (typically above 500° C.) necessary to obtain highly crystalline materials is a major challenge for thin kesterite film fabrication, potentially limiting the performance of this technology. Sn loss has been observed with all reported annealing approaches, such as tubular furnaces, hot plate annealing and rapid thermal annealing.

Therefore, improved annealing techniques for kesterite materials would be desirable.

SUMMARY OF THE INVENTION

The present invention provides techniques for minimizing loss of volatile components during thermal processing of kesterite films. In one aspect of the invention, a method for annealing a kesterite film is provided. The method includes: placing a cover over the kesterite film; and annealing the cover and the kesterite film such that, for an entire duration of the annealing, the cover is at a temperature T1 and the kesterite film is at a temperature T2, wherein the temperature T1 is greater than or equal to the temperature T2.

In another aspect of the invention, a method for forming a solar cell is provided. The method includes: forming a kesterite absorber film on a substrate; placing a cover over the kesterite absorber film and the substrate; and annealing the cover and the kesterite absorber film such that, for an entire duration of the annealing, the cover is at a temperature T1 and the kesterite film is at a temperature T2, wherein T1 is greater than or equal to T2.

In yet another aspect of the invention, a solar cell is provided. The solar cell includes: a substrate; a conductive layer on the substrate; a kesterite absorber film on the conductive layer; a buffer layer on the kesterite absorber film; a transparent front contact on the buffer layer; and metal contacts on the transparent front contact.

In still yet another aspect of the invention, another method for annealing a kesterite film is provided. The method includes: placing a cover over the kesterite film; and annealing the cover and the kesterite film, wherein during the annealing: i) for ramp up and hold segments of the annealing, the cover is at a temperature T1 and the kesterite film is at a temperature T2, wherein the temperature T1 is greater than or equal to the temperature T2, and ii) for a cool down segment of the annealing, conditions are reversed such that the temperature T1 is less than the temperature T2.

A more complete understanding of the present invention, as well as further features and advantages of the present invention, will be obtained by reference to the following detailed description and drawings.

DETAILED DESCRIPTION OF PREFERRED EMBODIMENTS

Figure 1:
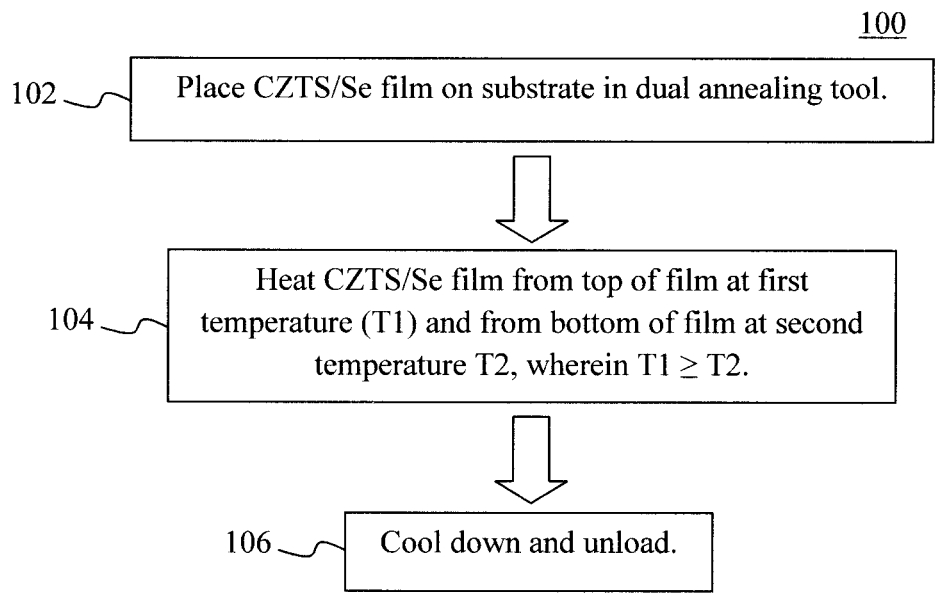
FIG. 1 is a diagram illustrating an exemplary methodology for annealing a CZTS/Se film according to an embodiment of the present invention.

As provided above, the loss of volatile components, such as tin (Sn), during annealing of kesterite materials such as CZTS/Se presents a notable challenge for large-scale implementation of these materials. The term "CZTS/Se" as used herein refers to materials containing copper (Cu), zinc (Zn), tin (Sn), and at least one of sulfur (S) and selenium (Se). Advantageously, it has been determined herein that a major contributor to Sn loss during annealing is the condensation of volatile Sn species on cooler surfaces. However, if all of the surfaces proximate to the film are kept at a temperature that is greater than or equal to the temperature of the film, then the volatile Sn species will be directed back to the film since they will not condense on a hotter surface. Further, it is found herein that the majority of Sn is lost from the surface of the film. Thus, according to an exemplary embodiment, surfaces proximate to the surface of the film are maintained at a temperature that is equal to or greater than the temperature of the film, both during ramp up and hold.

It is notable that there are several different stages to an annealing process. For instance, when an article is first placed on a hot plate there is a ramp up period during which time the article is brought up to a set temperature. With CZTS/Se samples, this set temperature can be greater than or equal to about 500° C. (e.g., a temperature of from about 500° C. to about 700° C., and ranges therebetween. Once the set temperature is reached, the article is maintained at that temperature for a certain given duration. For example, CZTS/Se samples may be maintained at or above 500° C. for a duration of from about 1 minute to about 30 minutes, and ranges therebetween). Finally, a cool down period follows where the article is brought back down to room temperature. According to the present techniques, the temperature and/or duration of each of these annealing stages can be regulated.

Further, according to the present techniques, it is assumed that the annealing temperature from the top and the bottom of the CZTS/Se sample can be independently regulated. What this means is that with a planar article, such as a CZTS/Se film on a substrate, heating from the bottom side of the article (i.e., the substrate side) can be at one temperature and, independently, heating from the top side of the article (i.e., the CZTS/Se film side) can be at another temperature. By way of example only, suitable annealing apparatus configurations for independently regulating the temperature of the top and bottom of an article are described in U.S. patent application Ser. No. 15/255,871, entitled "Precision Dual Annealing Apparatus," (hereinafter "U.S. patent application Ser. No. 15/255,871"), the contents of which are incorporated by reference as if fully set forth herein. In U.S. patent application Ser. No. 15/255,871 an annealing apparatus is described wherein the temperature of top and bottom heating plates can be independently regulated (via independent controllers and cooling sources). Therefore, an article placed in between the heating plates can be heated at its top side to a different temperature than its bottom side, and vice versa. The cooling sources can be air cooled devices (e.g., enclosures containing fans and vents for directing airflow towards/away from the heating plates) or a water-cooled cooling brake that can be brought (independently) into contact with the top heating plate and/or the bottom heating plate to initiate cooling.

FIG. 1 is a diagram illustrating an exemplary methodology 100 for annealing a CZTS/Se film according to the present techniques. According to an exemplary embodiment, the CZTS/Se film is present on a substrate. For solar device applications, suitable substrates include, but are not limited to, glass, ceramic, metal foil, or plastic substrates. A conductive layer might also be formed on the substrate. This conductive layer serves as the bottom electrode of the device. In that case the CZTS/Se film will be present on the conductive layer. Suitable conductive layer materials include, but are not limited to, molybdenum (Mo), nickel (Ni), tantalum (Ta), tungsten (W), aluminum (Al), platinum (Pt), titanium nitride (TiN), silicon nitride (SiN), and combinations thereof, which can be deposited onto the substrate using a process such as evaporation or sputtering. A suitable process and apparatus for forming a CZTS/Se film on a substrate are described, for example, in U.S. Pat. No. 9,349,906 issued to Mahajan et al., entitled "Anneal Techniques for Chalcogenide Semiconductors," the contents of which are incorporated by reference as if fully set forth herein.

In step 102, the CZTS/Se film/substrate are placed in a dual annealing apparatus. As described above, a dual annealing apparatus is a tool that can independently heat the bottom (substrate) side of the article independently (i.e., to a different temperature/for a different duration) from the top (film) side of the article. In the example of a dual annealing apparatus as described in U.S. patent application Ser. No. 15/255,871, the CZTS/Se film/substrate are placed in between the top and bottom heating plates.

Optionally, the CZTS/Se film/substrate is contained in an annealing chamber. According to one exemplary embodiment, the annealing chamber simply includes a quartz lid placed over the CZTS/Se film/substrate. More complex annealing chamber arrangements are, however, contemplated herein. For example, the annealing apparatus described in U.S. patent application Ser. No. 15/255,871 contains a (quartz) annealing chamber with a clamshell design having one half of the annealing chamber attached to the top heating plate and a second half of the annealing chamber attached to the bottom heating plate such that, when the top heating plate and the bottom heating plate are brought together, the two halves form an airtight enclosure around the article. Whether or not an annealing chamber is used, what is important is that the surfaces of the annealing device (whether it be a quartz lid, a chamber enclosure, or simply the top heating plate itself) adjacent to the CZTS/Se film are heated to the same or a higher temperature than the CZTS/Se film itself. Otherwise, volatiles like Sn will condense on these surfaces.

In step 104, the CZTS/Se film is heated from a top of the film at a first temperature (T1) and the CZTS/Se film is heated from a bottom of the film at a second temperature (T2), wherein the first temperature is greater than or equal to the second temperature, i.e., T1≥T2. The heating performed from the bottom of the film (i.e., from the substrate side of the sample) will control the temperature of the CZTS/Se film. The heating performed from the top of the film will dictate the temperature of the surfaces surrounding the CZTS/Se film. See for example FIG. 2 which illustrates an exemplary embodiment for heating the CZTS/Se film from the top and from the bottom using a dual annealing apparatus.

Figure 2:
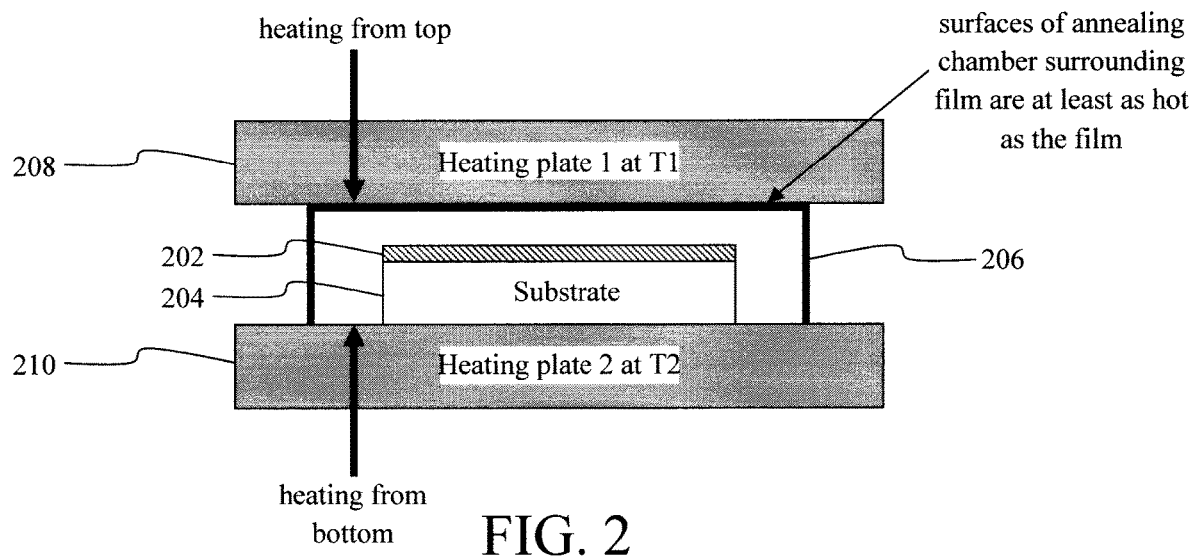
FIG. 2 is a diagram illustrating an exemplary embodiment for heating the CZTS/Se film from the top and from the bottom using a dual annealing apparatus according to an embodiment of the present invention.

As shown in FIG. 2, a CZTS/Se film 202 on a substrate 204 is placed (within a quartz cover 206) between a first heating plate 208 (heating plate 1) and a second heating plate 210 (heating plate 2). Heating plate 208 and heating plate 210 can independently heat the CZTS/Se film 202 and the cover 206 from the top and from the bottom, respectively. For instance, heating plate 208 is at a first temperature T1 and heating plate 210 is at a second temperature T2. In this exemplary configuration, heating plate 208 will be primarily responsible for regulating the temperature (T1) of the cover 206, and heating plate 210 will be primarily responsible for regulating the temperature (T2) of the film 202. However, it is notable that ultimately the goal is to keep the temperature T1 of the cover 206 to be greater than or equal to the temperature T2 of the film 202. Thus, adjustments to the settings of the heating plates 208/210 may be necessary to achieve these respective temperatures T1 and T2 in the articles being annealed (e.g., the cover 206 and the film 202). These adjustments are within the capabilities of one skilled in the art. As provided above, it is important that T1 be greater than or equal to T2 in order to prevent volatile Sn from the film from condensing on cooler surfaces surrounding the film. Namely, in this example, if the film was heated (based on the temperature of heating plate 210) to temperature T2, and the surfaces of the annealing chamber 206 were at a temperature less than T2, then volatile Sn from the film 202 would undesirably condense on the cooler surfaces of the annealing chamber 206. This loss of Sn from the film to the annealing chamber surfaces would make it hard to control the final Sn composition of the film during annealing. On the other hand if, by way of the present techniques, the surfaces of the annealing chamber are kept at a temperature T1 that is greater than or equal to temperature T2, then the volatile Sn would not have a cooler surface to condense on. The volatile Sn would then be directed back to the film. Sn loss during annealing would thus be minimal. The temperature T1 of the annealing chamber is controlled in this example via the heating plate 208. It is notable that FIG. 2 provides a basic overview of the dual annealing apparatus and other components may be employed in practice. For instance, as described above, a cooling component may be present that contributes to regulating the temperature of the heating plates.

According to an exemplary embodiment, heating is performed from a top side of the CZTS/Se film at a first temperature (T1) of from about 500° C. to about 700° C., and ranges therebetween, and heating is performed from a bottom side of the CZTS/Se film at a second temperature (T2) of from about 500° C. to about 700° C., and ranges therebetween. T1 must, however, be greater than or equal to T2, i.e., T1≥T2. This requirement holds true throughout the ramp up and hold (see above). For instance, during the temperature ramp up, the top side temperature should always be at least as high as the bottom side temperature. Once the given set temperatures (top and bottom side temperatures) are reached, the CZTS/Se film/substrate is maintained at these temperatures (for the given duration—see above), during which time the top side is always kept at a temperature that is at least as high as the bottom side temperature.

Contrast, for example, a process where a CZTS/Se film/substrate sample is simply placed on a hot plate for the anneal and covered with a quartz lid as an annealing chamber. In that case, heating solely from the bottom of the sample will the leave the surfaces of the annealing chamber at a lower temperature than the CZTS/Se film. Volatile Sn from the film will thus have a cooler surface (i.e., the surfaces of the annealing chamber) on which to condense.

According to an exemplary embodiment, heating from the top side of the CZTS/Se film is performed at a higher temperature than the heating from the bottom side of the CZTS/Se film, namely temperature T1 is greater than temperature T2, i.e., T1>T2. For example, T1 in that case can be from about 30° C. to about 150° C. greater than T2. Employing a greater temperature at the top of the sample ensures that the surfaces surrounding the CZTS/Se film are at least at the same temperature as the film itself.

Following the anneal ramp-up and hold, the CZTS/Se film is permitted to cool (e.g., to room temperature, after which the CZTS/Se film/substrate is removed from the dual annealing apparatus. See step 106.

Figure 1A:
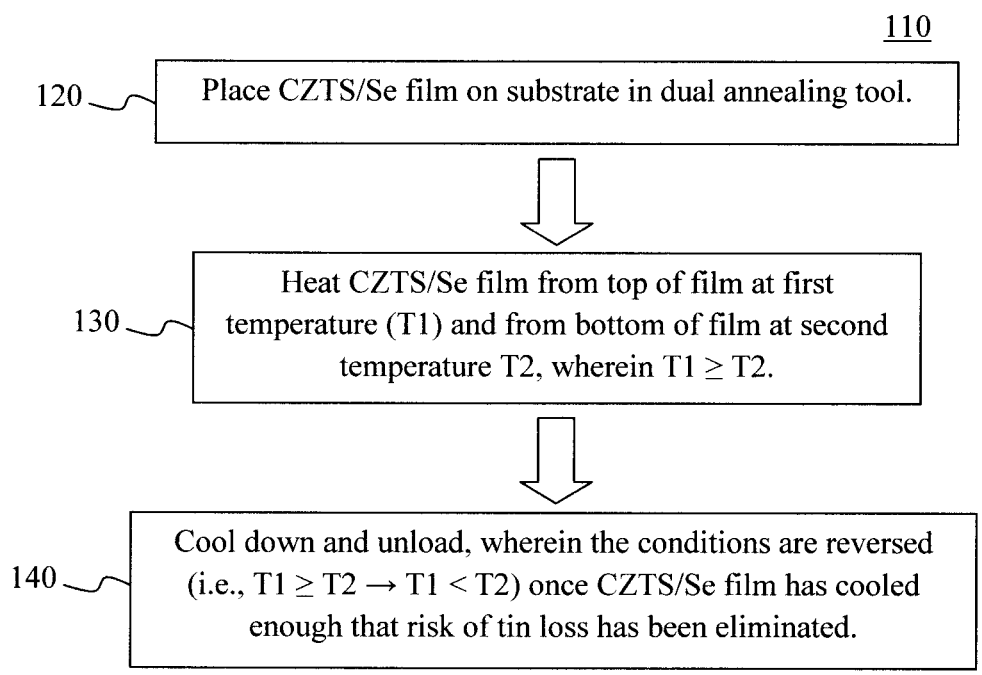
FIG. 1A is a diagram illustrating a variation of the methodology of FIG. 1 where the heating conditions are reversed once the CZTS/Se film has cooled down enough that risk of tin loss has been eliminated according to an embodiment of the present invention.

It is notable that during the cool down, once the temperature of the CZTS/Se film/substrate is reduced (e.g., to a temperature of from about 200° C. to about 500° C., and ranges therebetween), the risk of tin loss is minimal. Thus, the constraint of T1≥T2 can be relaxed, or even reversed, during the cool down. For instance, according to an exemplary embodiment, the condition T1≥T2 is excluded on some process segments, in particular the ramp down. See, e.g., methodology 110 of FIG. 1A. This advantageously permits other volatiles such as sulfur and/or selenium which are present in the atmosphere to condense on the sample surface.

Methodology 110 proceeds in the same general manner as methodology 100 (of FIG. 1) above through the ramp up and hold. For instance, in step 120 the CZTS/Se film/substrate are placed in a dual annealing apparatus, and in step 130 the CZTS/Se film is heated from a top of the film at a first temperature (T1) and the CZTS/Se film is heated from a bottom of the film at a second temperature (T2), wherein the first temperature is greater than or equal to the second temperature, i.e., T1≥T2. This condition (i.e., T1≥T2) is imposed throughout the entire ramp up and hold.

However, during the cool down in step 140, once the CZTS/Se film/substrate have cooled down to a temperature of from about 200° C. to about 500° C., the risk of tin loss is eliminated, and the condition is reversed to where T1<T2.

This reversal will prevent condensation of other volatile species on the sample surface such as S or Se (since the now higher CZTS/Se film/substrate temperature will facilitate expulsion of these volatile species from the sample. By way of example only, the reversal can be achieved simply by removing the sample from the annealing apparatus, whereby the top of the sample will naturally cool faster than the bottom (i.e., making T1<T2).

The remainder of the process is then tailored to the particular device being fabricated. By way of example only, an exemplary embodiment for forming a CZTS/Se-based solar cell (i.e., a solar cell where the CZTS/Se film is the absorber material) is now described by way of reference to methodology 300 of FIG. 3. As provided above, the sample now contains a substrate, a layer of an electrically-conductive material on the substrate, and a CZTS/Se absorber on the conductive material.

In step 302, a buffer layer is formed on the CZTS/Se absorber. By way of example only, the buffer layer may be formed from at least one of cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), and aluminum oxide ($Al_2O_3$). According to an exemplary embodiment, the buffer layer is formed on the CZTS/Se absorber using standard chemical bath deposition.

In step 304, a transparent front contact is formed on the buffer layer. By way of example only, the transparent front contact may be formed from a transparent conductive oxide (TCO) such as indium-tin-oxide (ITO) and/or aluminum-doped zinc oxide (AZO). According to an exemplary embodiment, the transparent front contact is formed on the buffer layer by sputtering.

Figure 4:
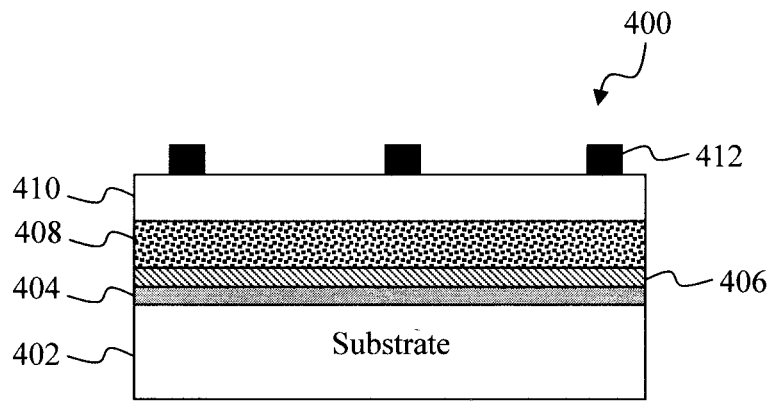
FIG. 4 is a diagram illustrating an exemplary CZTS/Se-based solar cell according to an embodiment of the present invention.

Finally, in step 306, metal contacts are formed on the transparent front contact. As shown in FIG. 4 (described below), the metal contacts do not have to fully cover the top surface of the solar cell. This permits light to pass through to the photoactive layers of the device. By way of example only, the metal contacts may be formed from aluminum (Al) and/or nickel (Ni). According to an exemplary embodiment, the metal contacts are formed on the transparent front contact using sputtering or evaporation.

Figure 3:
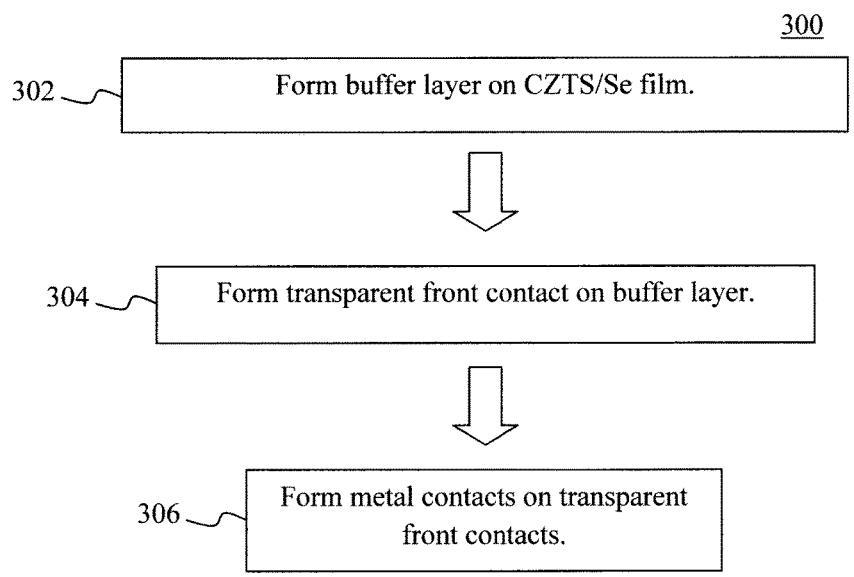
FIG. 3 is a diagram illustrating an exemplary methodology for forming a CZTS/Se-based solar cell according to an embodiment of the present invention.

FIG. 4 is a diagram illustrating an exemplary solar cell 400 formed in accordance with methodology 300 of FIG. 3. As shown in FIG. 4, the solar cell 400 includes a substrate 402, a conductive layer 404 on the substrate 402, a CZTS/Se absorber 406 on the conductive layer 404, a buffer layer 408 on the CZTS/Se absorber 406, a transparent front contact 410 on the buffer layer 408, and metal contacts 412 on the transparent front contact 410. The metal contacts 412 do not completely cover the top surface of the solar cell 400 in order to permit light to pass through to the CZTS/Se absorber 406.

Figure 5:
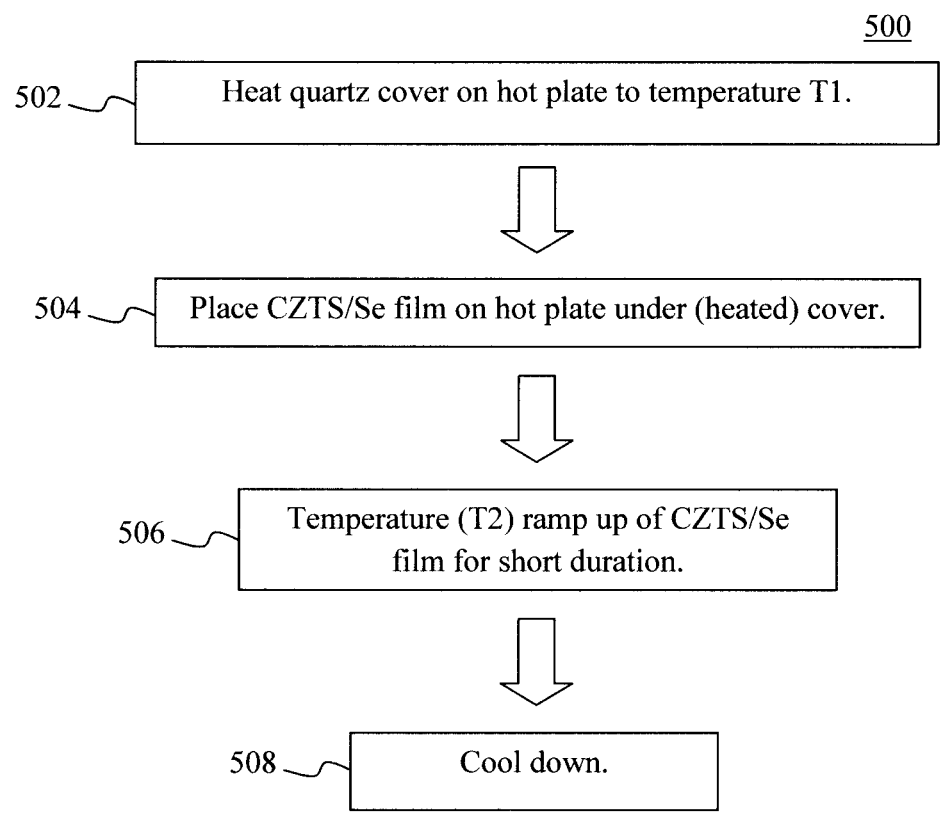
FIG. 5 is a diagram illustrating another exemplary methodology for annealing a CZTS/Se film according to an embodiment of the present invention.

As described above, a dual annealing apparatus is a convenient tool for implementing the present techniques. However, a dual annealing tool is not required to perform the present techniques. For instance, it has been found herein that implementing a hotter top temperature (i.e., T1 is greater than T2), and a shorter annealing duration, one can minimize Sn loss in the same manner described above using a pre-heat step of the quartz cover. See for example methodology 500 of FIG. 5.

Namely, in step 502 a quartz cover is placed on a hot plate and heated to temperature T1 (for example a T1 of greater than or equal to about 500° C., e.g., T1 is from about 500° C. to about 700° C., and ranges therebetween). Once the cover reaches temperature T1, in step 504 the CZTS/Se film/substrate is placed on the hot plate, under the (heated) cover. As such, the film will initially be at a lower temperature (T2) than the cover (T1), i.e., T1>T2.

In step 506, the temperature of the film will increase (ramp-up). One must monitor the duration such that the temperature (T2) of the film never exceeds the temperature (T1) of the cover. Otherwise, condensation of volatiles from the film, such as Sn can occur. According to an exemplary, a short annealing duration of from about 1 minute to about 3 minutes, and ranges therebetween are employed, during which the temperature (T2) of the film will not exceed the temperature (T1) of the cover. Namely, the hot plate and the cover are at the set temperature (T1). However, placing the film on the hot plate under the cover for such a short duration, the film will not reach a temperature (T2) that exceeds temperature (T1).

Thus, in step 508, once the film has been heated for the given duration, it is removed from the hot plate and permitted to cool (cool-down). Advantageously, as will be described below, no Sn is deposited onto the cover based on this process.

It is notable that methodology 500 can also be performed using a dual annealing apparatus. For instance, as per step 502, the quartz cover can be heated via the top heating plate of the apparatus. Once the set temperature (T1) is reached, as per step 504, the CZTS/Se film/substrate can be placed in the apparatus (under the cover) between the top heating plate and the bottom heating plate. As per step 506, the bottom heating plate can be used to heat up the film (ramp-up) for the given duration (such that during the ramp-up the temperature (T2) of the film/bottom heating plate never exceeds the temperature (T1) of the cover/top heating plate). Advantageously, the cool-down as per step 508 can be accomplished without removing the film from the dual annealing apparatus, for example, by selectively initiating cooling at the bottom heating plate using the cooling source. It is notable that temperatures T1, T2, etc. described herein are those of the articles being annealed (e.g., the film, the cover, etc.) and that, given the present teachings, one skilled in the art could make adjustments to the temperature settings of the hot plate, heating plates of the dual annealing apparatus, etc. to achieve these temperatures in the article(s) being annealed.

The present techniques are further described by way of reference to the following non-limiting examples. A first set of CZTS/Se film samples (samples A-D) were prepared using the present annealing techniques with the following top/bottom temperature configurations:

Sample: A—590° C./590° C. (symmetric top and bottom heating)
  B—600° C./560° C.
  C—620° C./500° C.
  D—630° C./450° C.

A second set of CZTS/Se baseline (against which samples A-D can be compared) film samples (samples E-I) samples were also prepared. These baseline samples included an additional 2 milligrams (mg) of sulfur (S). Namely, in addition to Sn, other volatile components of CZTS/Se films include S and Se. The Sn lost due to desorption from the film is generally not elemental Sn, but occurs primarily in the form of tin sulfide (SnS). See, for example, A. Weber et al., "On the Sn loss from thin films of the material system Cu—Zn—Sn—S in high vacuum," Journal of Applied Physics 107, 013516 (January 2010) (hereinafter "Weber"), the contents of which are incorporated by reference as if fully set forth herein. Thus, carrying out high temperature anneals (e.g., at or above 500° C.) in a sulfur environment (e.g., $H_2S$)

can mitigate the loss of Sn. See Weber. Accordingly, the baseline processes presented herein can be carried out in a S and/or Se-containing environment. The baseline samples (denoted with an "S") were prepared with the following top/bottom temperature configurations:

Sample: E(S)—590° C./590° C. (symmetric top and bottom heating)
G(S)—600° C./560° C.
H(S)—620° C./500° C.
I(S)—630° C./450° C.

As provided above, the present techniques involve employing a top temperature that is greater than or equal to the bottom temperature. First evaluated was the scenario where the top temperature is equal to the bottom temperature (i.e., symmetric top and bottom heating). In this example, four different (symmetric) top/bottom temperature configurations were employed:
580° C./580° C.
590° C./590° C.
600° C./600° C.
610° C./610° C.

With samples prepared using a conventional hot plate (and thus where the temperature of the film is undesirably greater than the cover) the Sn loss (due to desorption) is typically around 5%. Thus, in order to compensate for this loss, conventional processes increase the Sn composition (above the desired final composition) to accommodate for this loss. In order to validate the effectiveness of the present techniques, the Sn composition in the above samples was adjusted to have 5% less Sn than the baseline (hot plate) samples. Advantageously, it was found that with symmetric top and bottom heating the final film (post annealing) had the same composition as the baseline (hot plate) samples (post annealing), meaning that the extra Sn added in the baseline samples was lost whereas no significant Sn loss was experienced with the present techniques.

Figure 6:
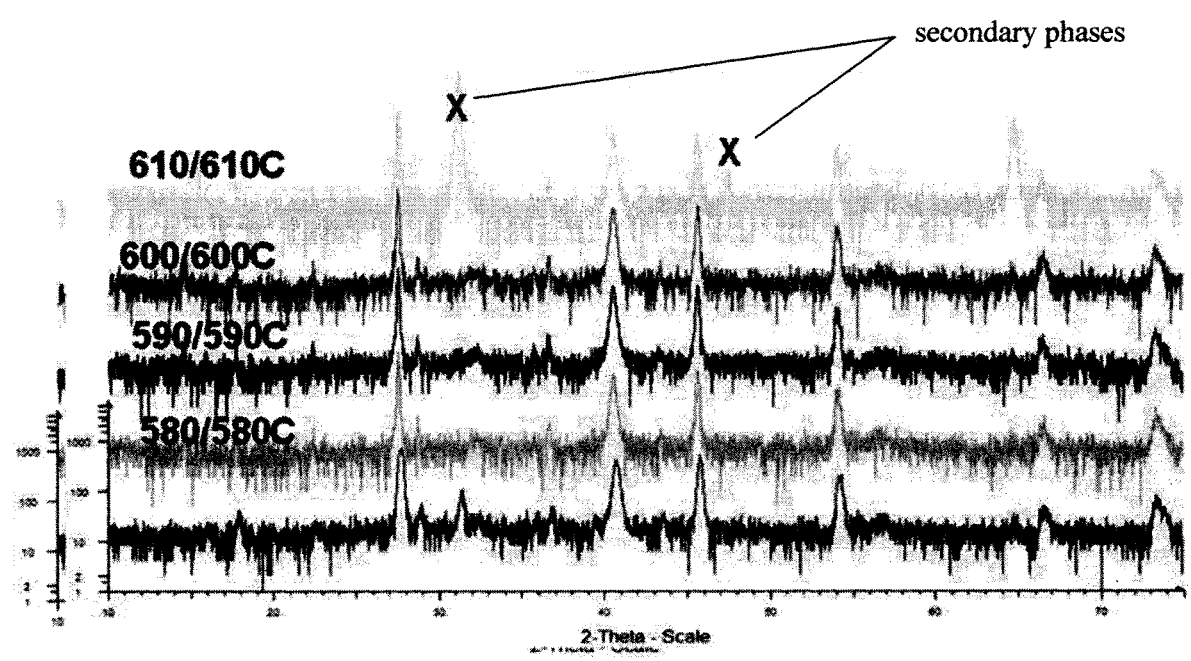
FIG. 6 is a compositional analysis of samples prepared according to the present techniques using symmetric top and bottom heating according to an embodiment of the present invention.

X-ray diffraction scans of the above samples are provided in FIG. 6. As shown in FIG. 6, there was no significant presence of secondary phases associated with Sn loss fluctuations up to 600° C., and no secondary phases formed up to 600° C.

Figure 7:
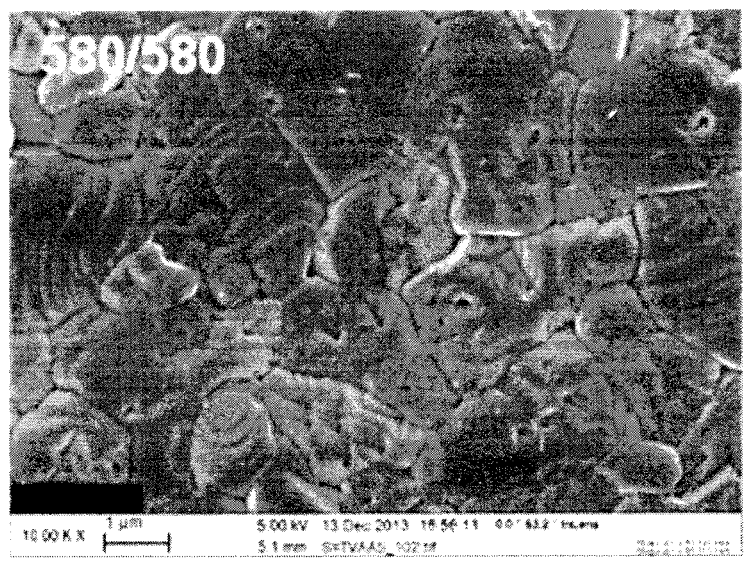
FIG. 7 is a top down image of a sample prepared according to the present techniques using symmetric top/bottom heating at 580° C./580° C. according to an embodiment of the present invention.
Figure 8:
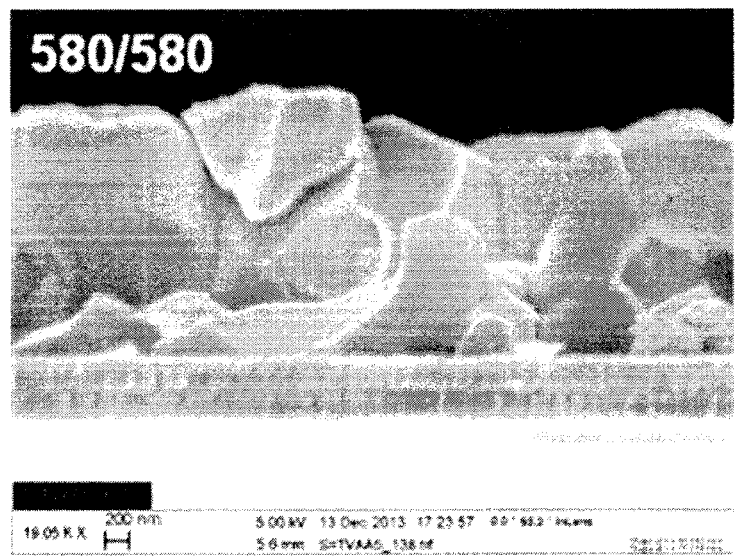
FIG. 8 is a side view image of the sample prepared according to the present techniques using symmetric top/bottom heating at 580° C./580° C. according to an embodiment of the present invention.
Figure 9:
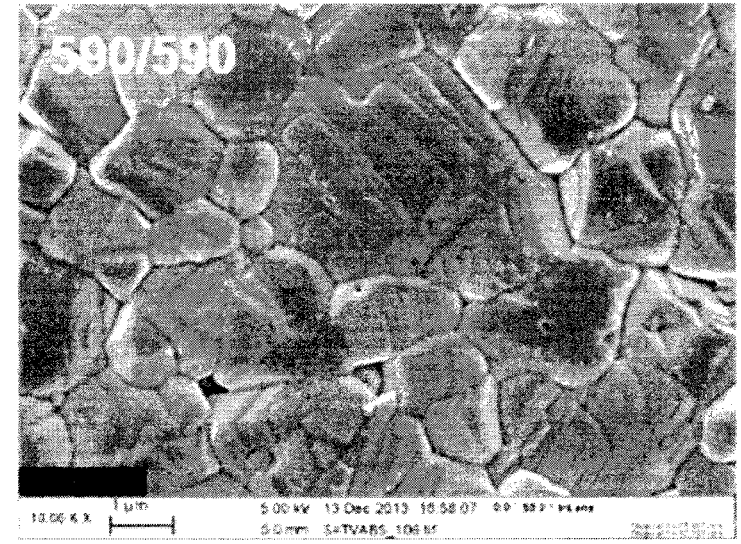
FIG. 9 is a top down image of a sample prepared according to the present techniques using symmetric top/bottom heating at 590° C./590° C. according to an embodiment of the present invention.
Figure 10:
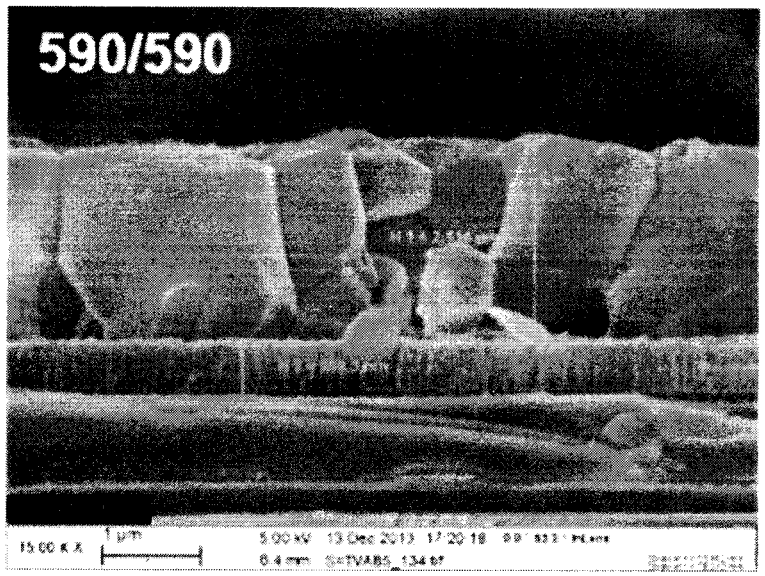
FIG. 10 is a side view image of the sample prepared according to the present techniques using symmetric top/bottom heating at 590° C./590° C. according to an embodiment of the present invention.
Figure 11:
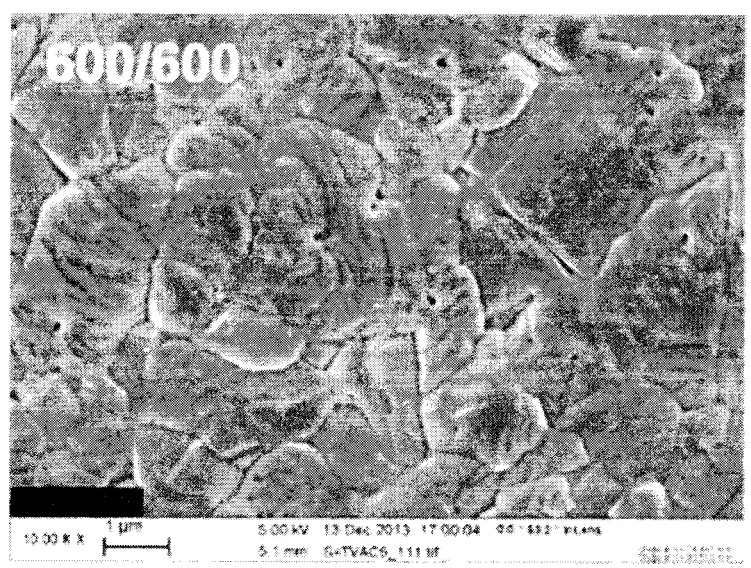
FIG. 11 is a top down image of a sample prepared according to the present techniques using symmetric top/bottom heating at 600° C./600° C. according to an embodiment of the present invention.
Figure 12:
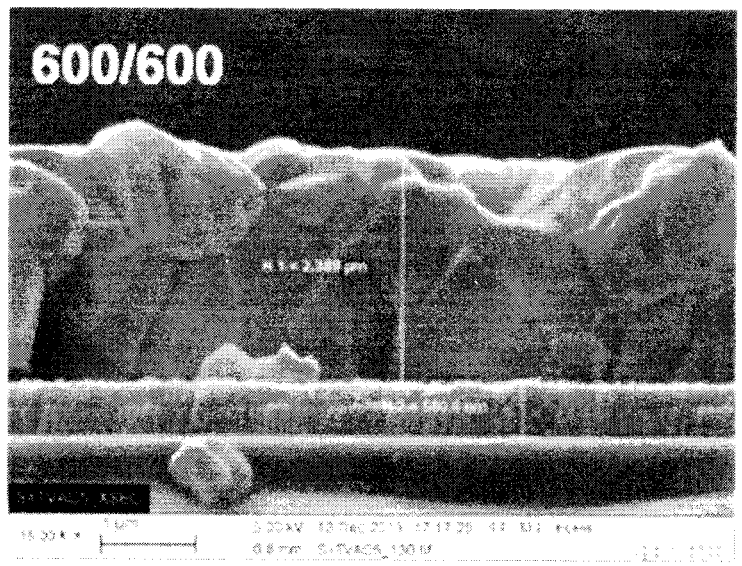
FIG. 12 is a side view image of the sample prepared according to the present techniques using symmetric top/bottom heating at 600° C./600° C. according to an embodiment of the present invention.
Figure 13:
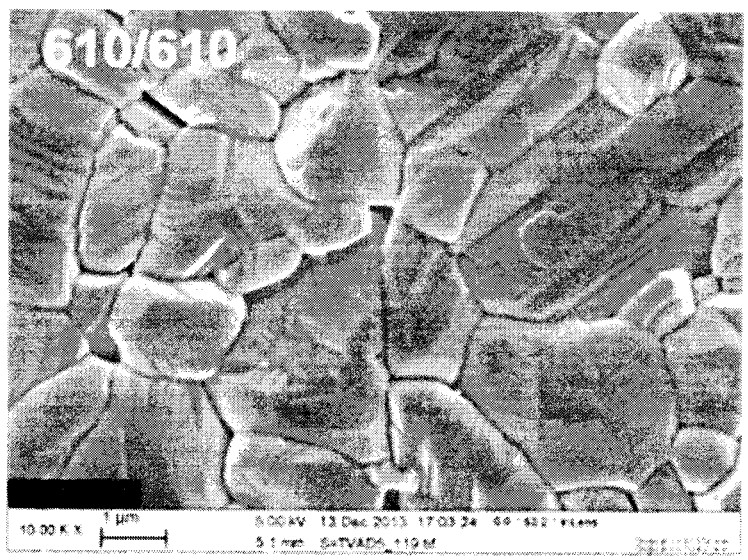
FIG. 13 is a top down image of a sample prepared according to the present techniques using symmetric top/bottom heating at 610° C./610° C. according to an embodiment of the present invention.
Figure 14:
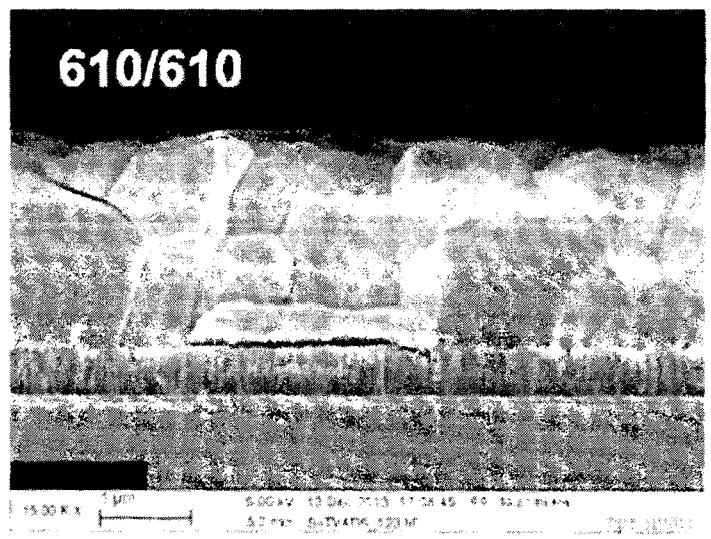
FIG. 14 is a side view image of the sample prepared according to the present techniques using symmetric top/bottom heating at 610° C./610° C. according to an embodiment of the present invention.

FIG. 7 is a top down image of the above sample prepared using symmetric top/bottom heating at 580° C./580° C. FIG. 8 is a side view image of the 580° C./580° C. sample. FIG. 9 is a top down image of the above sample prepared using symmetric top/bottom heating at 590° C./590° C. FIG. 10 is a side view image of the 590° C./590° C. sample. FIG. 11 is a top down image of the above sample prepared using symmetric top/bottom heating at 600° C./600° C. FIG. 12 is a side view image of the 600° C./600° C. sample. FIG. 13 is a top down image of the above sample prepared using symmetric top/bottom heating at 610° C./610° C. FIG. 14 is a side view image of the 610° C./610° C. sample.

Figure 15A:
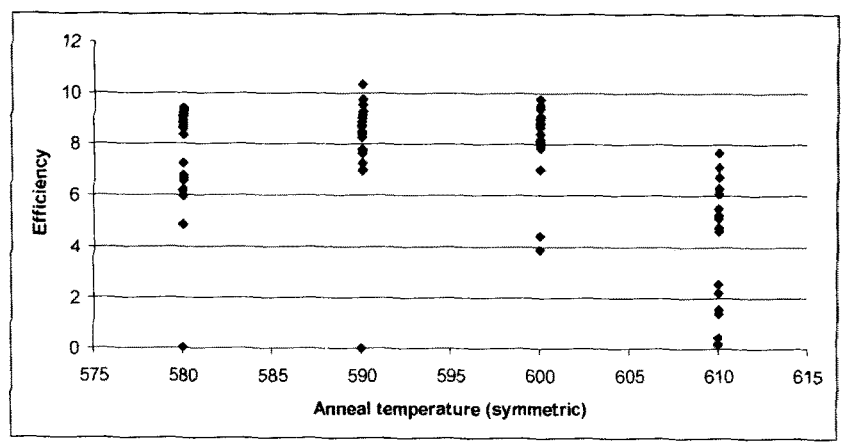
FIG. 15A is a diagram illustrating the efficiency of the symmetric top/bottom heating samples according to an embodiment of the present invention.
Figure 15B:
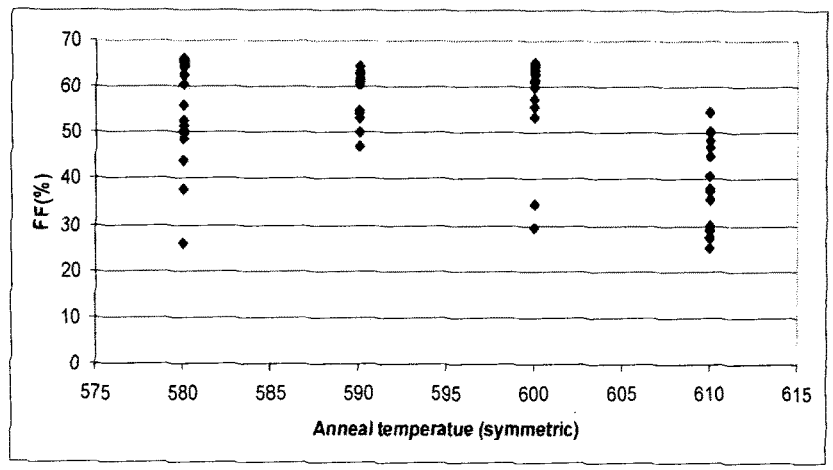
FIG. 15B is a diagram illustrating the fill factor (FF) of the symmetric top/bottom heating samples according to an embodiment of the present invention.
Figure 15C:
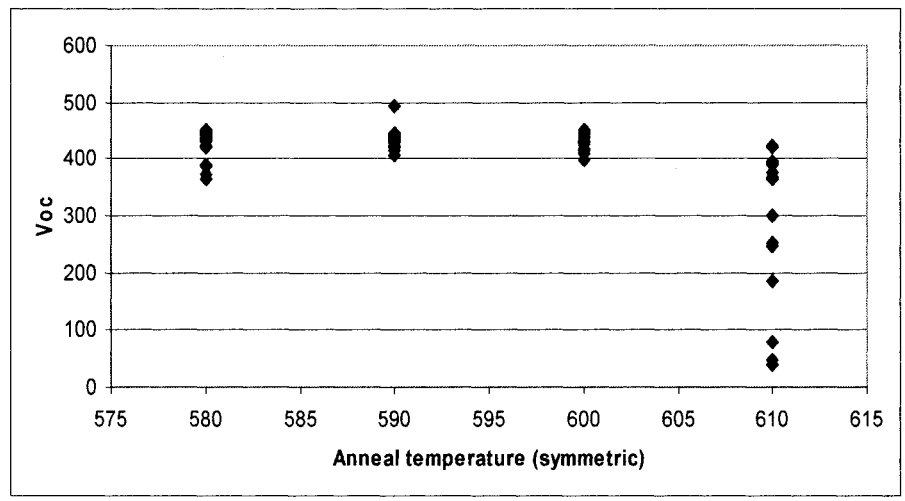
FIG. 15C is a diagram illustrating the open circuit voltage (Voc) of the symmetric top/bottom heating samples according to an embodiment of the present invention.
Figure 15D:
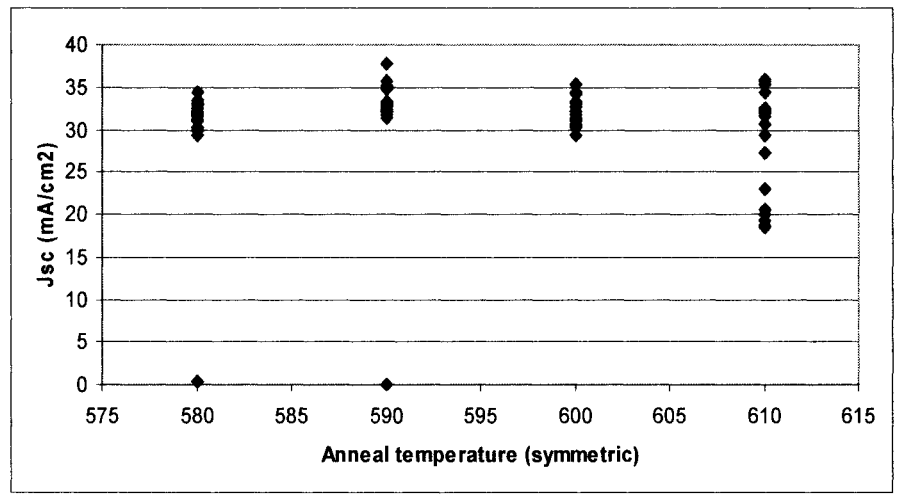
FIG. 15D is a diagram illustrating the short circuit current (Jsc) of the symmetric top/bottom heating samples according to an embodiment of the present invention.

FIGS. 15A-D are diagrams illustrating performance of the above sample prepared using symmetric top/bottom heating as a function of annealing temperature. Specifically, FIG. 15A depicts the efficiency of the symmetric top/bottom heating samples. FIG. 15B depicts the fill factor (FF) of the symmetric top/bottom heating samples. FIG. 15C depicts the open circuit voltage (Voc) of the symmetric top/bottom heating samples. FIG. 15D depicts the short circuit current (Jsc) of the symmetric top/bottom heating samples.

Figure 16:
FIG. 16 is a side view image of a sample prepared according to the present techniques using asymmetric top/bottom heating at 630° C./590° C. for 3 minutes according to an embodiment of the present invention.
Figure 17:
FIG. 17 is a side view image of a sample prepared according to the present techniques using asymmetric top/bottom heating at 630° C./590° C. for 2 minutes according to an embodiment of the present invention.
Figure 18:
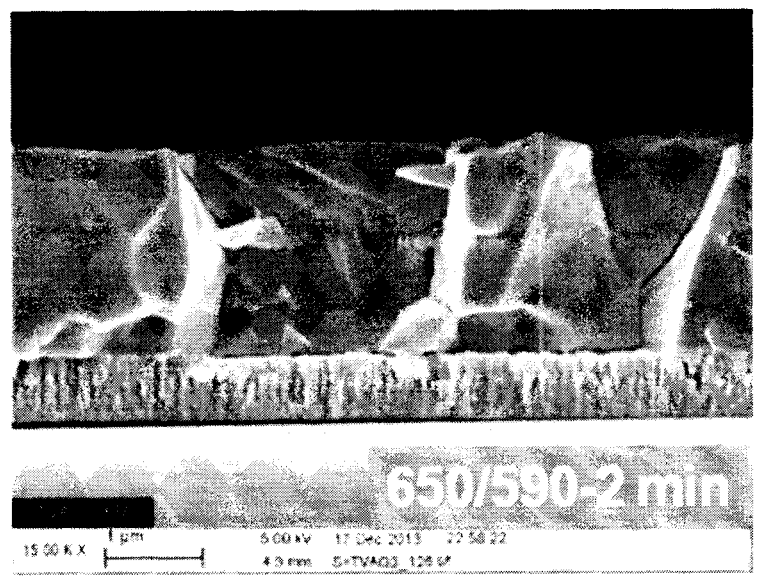
FIG. 18 is a side view image of a sample prepared according to the present techniques using asymmetric top/bottom heating at 650° C./590° C. for 2 minutes according to an embodiment of the present invention.

Next evaluated was the scenario where the top temperature is greater than the bottom temperature (asymmetric top/bottom temperatures). As described above, use of a higher top temperature can be implemented with shorter annealing times. In this example, three different (asymmetric) top/bottom temperature configurations were employed:
630° C./590° C. for 3 minutes
630° C./590° C. for 2 minutes
650° C./590° C. for 2 minutes Again, the starting composition was adjusted to have 5% less Sn than the (starting) baseline (hot plate) samples. FIG. 16 is a side view image of the above sample prepared using asymmetric top/bottom heating at 630° C./590° C. for 3 minutes. FIG. 17 is a side view image of the above sample prepared using asymmetric top/bottom heating at 630° C./590° C. for 2 minutes. FIG. 18 is a side view image of the above sample prepared using asymmetric top/bottom heating at 650° C./590° C. for 2 minutes.

Figure 19A:
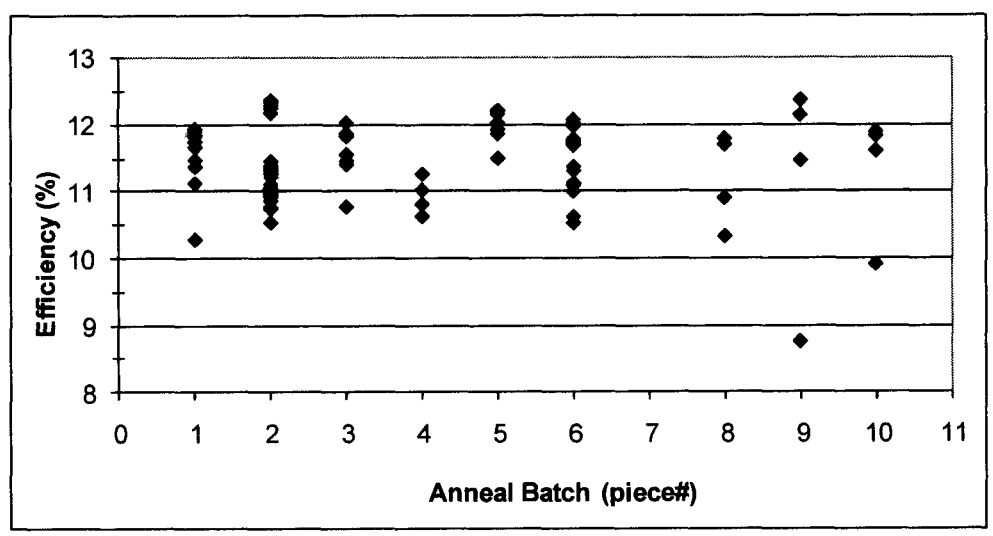
FIG. 19A is a diagram illustrating the efficiency of the asymmetric top/bottom heating samples according to an embodiment of the present invention.
Figure 19B:
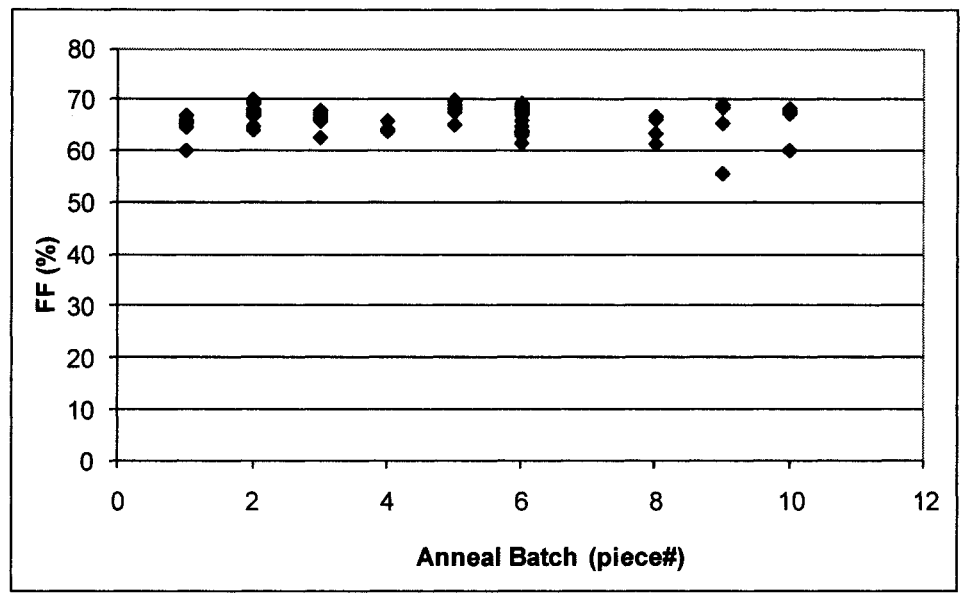
FIG. 19B is a diagram illustrating the FF of the asymmetric top/bottom heating samples according to an embodiment of the present invention.
Figure 19C:
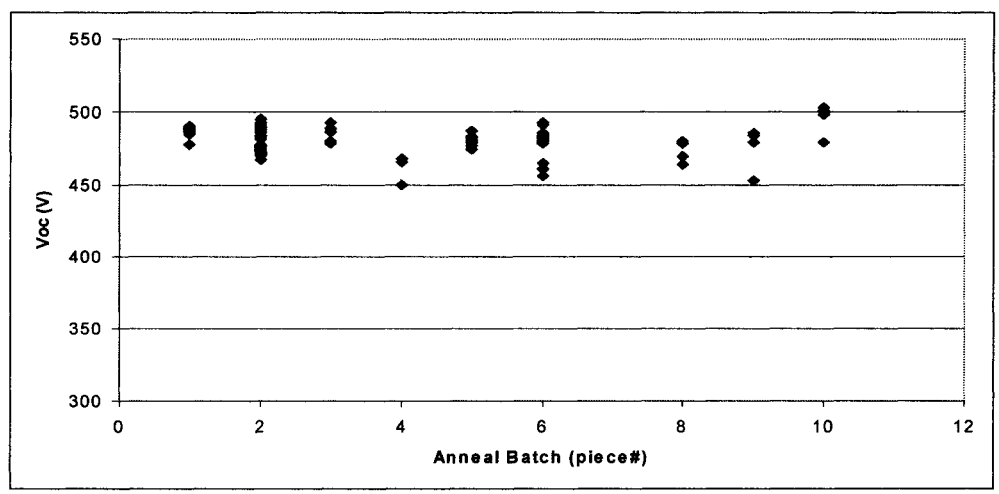
FIG. 19C is a diagram illustrating the Voc of the asymmetric top/bottom heating samples according to an embodiment of the present invention.
Figure 19D:
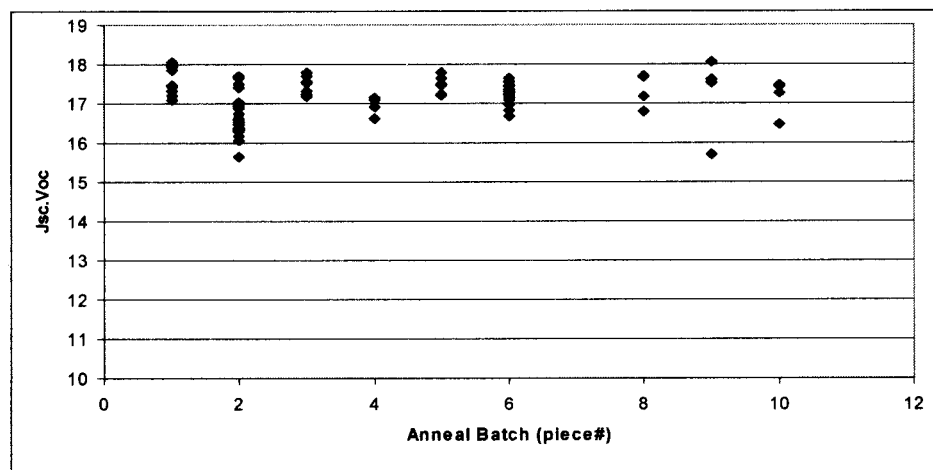
FIG. 19D is a diagram illustrating the Voc*Jsc of the asymmetric top/bottom heating samples according to an embodiment of the present invention.

FIGS. 19A-D are diagrams illustrating performance of the above sample prepared using asymmetric top/bottom heating as a function of annealing temperature. It can be noted that with high repeatability performance above 11% was obtained, in some cases reaching over 12.5% which is close to the current world record. Specifically, FIG. 19A depicts the efficiency of the asymmetric top/bottom heating samples. FIG. 19B depicts the FF of the asymmetric top/bottom heating samples. FIG. 19C depicts the Voc of the symmetric top/bottom heating samples. FIG. 19D depicts the Voc*Jsc of the symmetric top/bottom heating samples.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for annealing a kesterite film, comprising:
placing a cover over the kesterite film; and
annealing the cover at a temperature T1 and the kesterite film at a temperature T2 such that, for an entire duration of the annealing, the cover is annealed at the temperature T1 and the kesterite film is annealed at the temperature T2, wherein the temperature T1 is greater than the temperature T2.

2. The method of claim 1, further comprising:
annealing the cover and the kesterite film both i) from a top of the cover at the temperature T1 and ii) from a bottom of the kesterite film at the temperature T2.

3. The method of claim 1, wherein the annealing is performed from a top of the cover using a first heating plate that is at the temperature T1 over the cover, and wherein the annealing is performed from a bottom of the kesterite film using a second heating plate that is at the temperature T2 below the kesterite film.

4. The method of claim 1, wherein the kesterite film comprises copper (Cu), zinc (Zn), tin (Sn), and at least one of sulfur (S) and selenium (Se).

5. The method of claim 1, wherein the cover comprises a quartz lid.

6. The method of claim 1, wherein the temperature T1 and the temperature T2 are each greater than 500° C.

7. The method of claim 1, wherein the temperature T1 and the temperature T2 are each from 500° C. to 700° C., and ranges therebetween.

8. The method of claim 1, wherein the duration of the annealing is from 1 minute to 30 minutes, and ranges therebetween.

9. A method for forming a solar cell, comprising:
forming a kesterite absorber film on a substrate;
placing a cover over the kesterite absorber film and the substrate; and annealing the cover at a temperature T1 and the kesterite absorber film at a temperature T2 such that, for an entire duration of the annealing, the cover is annealed at the temperature T1 and the kesterite film is annealed at the temperature T2, wherein the temperature T1 is greater than the temperature T2, wherein the annealing is performed from a top of the cover using a first heating plate that is at the temperature T1 over the cover, and wherein the annealing is performed from a bottom of the kesterite film using a second heating plate that is at the temperature T2 below the kesterite film.

10. The method of claim 9, further comprising:
forming a conductive layer on the substrate.

11. The method of claim 9, further comprising:
forming a buffer layer on the kesterite absorber film;
forming a transparent front contact on the buffer layer; and
forming metal contacts on the transparent front contact.

12. The method of claim 9, wherein the kesterite absorber film comprises Cu, Zn, Sn, and at least one of S and Se.

13. The method of claim 9, wherein the temperature T1 and the temperature T2 are each greater than 500° C.

14. The method of claim 9, wherein the temperature T1 and the temperature T2 are each from 500° C. to 700° C., and ranges therebetween.

15. The method of claim 9, wherein the duration of the annealing is from 1 minute to 30 minutes, and ranges therebetween.

16. A method for annealing a kesterite film, comprising:
placing a cover over the kesterite film; and
annealing the cover and the kesterite film, wherein during the annealing: i) for ramp up and hold segments of the annealing, the cover is annealed at a temperature T1 and the kesterite film is annealed at a temperature T2, wherein the temperature T1 is greater than the temperature T2, and ii) for a cool down segment of the annealing, the temperature T1 is less than the temperature T2, wherein the annealing is performed from a top of the cover using a first heating plate that, for the ramp up and hold segments of the annealing, is at the temperature T1 over the cover, wherein the annealing is performed from a bottom of the kesterite film using a second heating plate that, for the ramp up and hold segments of the annealing, is at the temperature T2 below the kesterite film, and wherein the temperature T1 is greater than the temperature T2 for the ramp up and hold segments of the annealing.

* * * * *